United States Patent [19]

Gladd et al.

[11] Patent Number: 4,491,376
[45] Date of Patent: Jan. 1, 1985

[54] ELECTRICAL HEADER ASSEMBLY

[75] Inventors: Joseph H. Gladd, Cortland; Robert G. Plyler, Vienna; Lyle B. Suverison, Fowler, all of Ohio

[73] Assignee: General Motors Corporation, Detroit, Mich.

[21] Appl. No.: 419,934

[22] Filed: Sep. 20, 1982

[51] Int. Cl.³ .............................................. H01R 41/00
[52] U.S. Cl. ................................ 339/9 E; 339/17 LC; 339/176 MP
[58] Field of Search ............... 339/17 L, 17 LC, 9 E, 339/176 MP

[56] References Cited

U.S. PATENT DOCUMENTS

| | | | |
|---|---|---|---|
| 3,320,572 | 5/1967 | Schwartz | 339/17 |
| 3,493,916 | 2/1970 | Hansen | 339/17 LC |
| 3,616,534 | 11/1971 | Black | 29/747 X |
| 3,864,000 | 2/1975 | Coller et al. | 339/17 LC X |
| 4,008,941 | 2/1977 | Smith | 339/91 P |
| 4,054,345 | 10/1977 | Sherwood | 339/17 M |
| 4,176,448 | 12/1979 | Zahn et al. | 29/626 |
| 4,210,376 | 7/1980 | Hughes et al. | 339/17 LC |
| 4,293,179 | 10/1981 | Vonder | 339/176 MP |

OTHER PUBLICATIONS

Molex Catalog, p. 16G, 11/1979.

*Primary Examiner*—Eugene F. Desmond
*Attorney, Agent, or Firm*—F. J. Fodale

[57] ABSTRACT

A header assembly comprising a thermoplastic housing and two rows of metallic conductor pins is attached to a printed circuit board. The conductor pins have tails which are bent over anvil portions of the housing and project through slots in a locator plate at the conductor end of the housing. The locator plate slots have detents for retaining the bent tails in a pattern to facilitate assembly and soldering of the tails in a matching pattern of holes in the printed circuit board. Stress on the solder connections due to differential thermal expansion is reduced by flexure of the conductor pins in enlarged rearward cavity portions and slippage of the bent tails in the detents.

5 Claims, 6 Drawing Figures

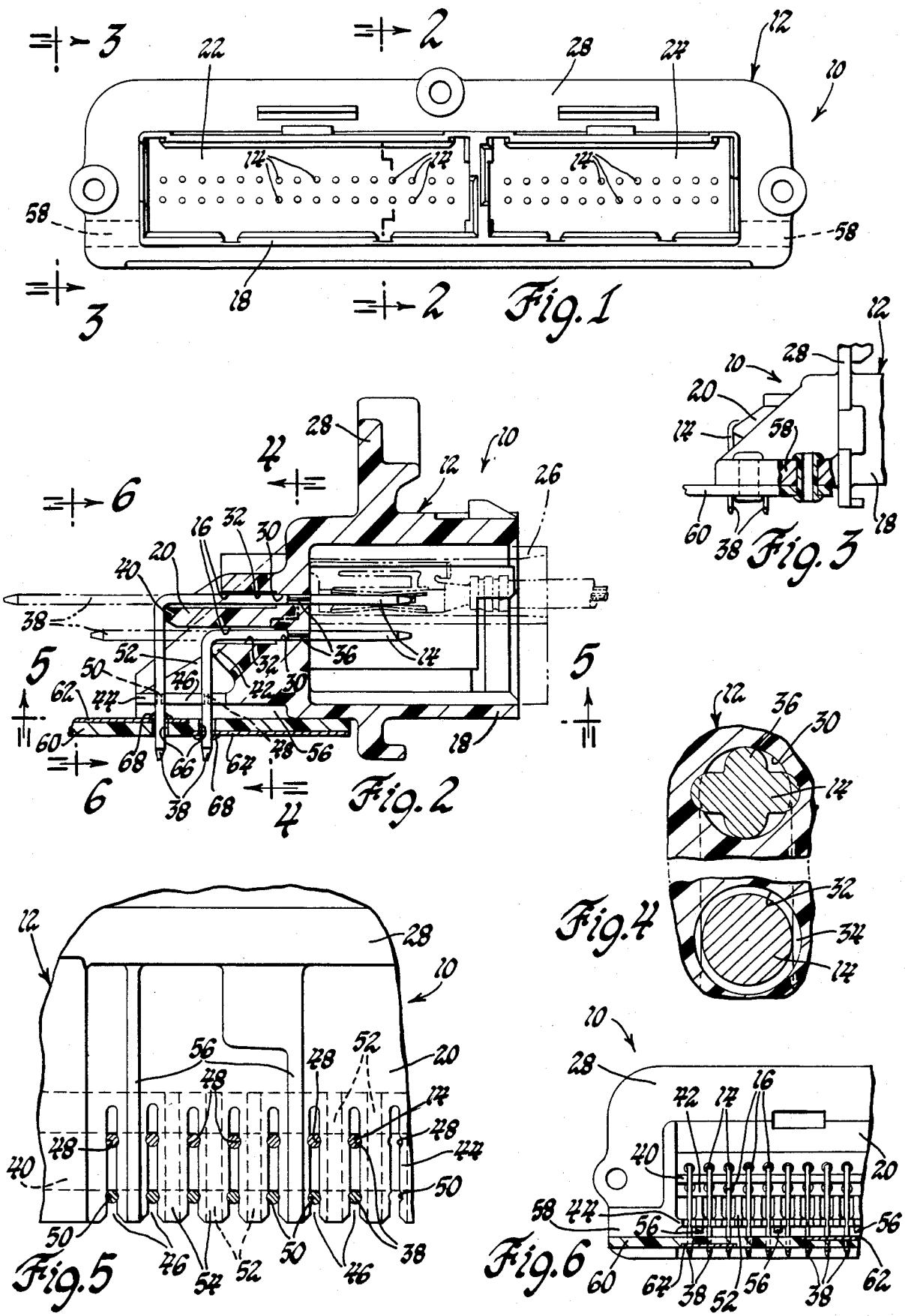

ELECTRICAL HEADER ASSEMBLY

This invention relates generally to electrical header assemblies for printed circuit boards and the like and, more particularly, to electrical header assemblies of the bent conductor pin-type.

It is common practice to make an electrical connection to a printed circuit board by means of an electrical header assembly which comprises a dielectric housing and a plurality of conductor pins. The conductor pins are inserted into longitudinal cavities of the housing until the tail ends project out the opposite end of the housing. The tail ends are then bent perpendicularly over anvil portions of the housing which locks the conductor pins in place and provides transversely projecting tails for electrical connection to the printed circuit board when the header assembly is attached. The printed circuit board has a precise pattern of holes which receives the projecting tails which are then soldered to the printed circuit board to provide a good electrical interface. See, for instance, U.S. Pat. No. 3,864,000 granted to James Ray Coller and Robert Franklin Cobough on Feb. 4, 1975.

The object of this invention is to provide an improved electrical header assembly of the above noted type.

One feature of the invention is that the electrical header assembly precisely locates the bent tails of the conductor pins to match the hole pattern in the printed circuit board thereby facilitating attachment of the electrical header assembly and improving the electrical interface.

Another feature of the invention is that the electrical header assembly accommodates differential thermal expansion between the dielectric housing and the conductor pins to reduce stress on the solder connections thereby permitting use of the assembly in a high temperature environment, such as an engine compartment of an automobile.

Other objects and features of the invention will become apparent to those skilled in the art as the disclosure is made in the following detailed description of a preferred embodiment of the invention as illustrated in the accompanying sheets of drawing in which:

FIG. 1 is a front view of an electrical header assembly in accordance with this invention.

FIG. 2 is a section taken substantially along the line 2—2 of FIG. 1 looking in the direction of the arrows and showing the electrical header assembly attached to a printed circuit board.

FIG. 3 is a fragmentary end view taken substantially along the line 3—3 of FIG. 1 and looking in the direction of the arrows.

FIG. 4 is a section taken substantially along the line 4—4 of FIG. 2 and looking in the direction of the arrows.

FIG. 5 is a fragmentary bottom view of the electrical header assembly taken substantially along the line 5—5 of FIG. 2 and looking in the direction of the arrows.

FIG. 6 is a fragmentary rear view taken substantially along the line 6—6 of FIG. 2 and looking in the direction of the arrows.

Referring now to the drawing, the electrical header assembly 10 comprises a dielectric housing 12 of a glass reinforced polyester or other suitable thermoplastic material and a plurality of conductor pins 14. A suitable material for the conductor pins is a tin plated brass although other suitable conductive materials may be used.

The housing 12 has two rows of longitudinal cavities 16 which extend through the housing from a mating end 18 to a conductor end 20. The mating end of the housing 12 has a pair of socket portions 22 and 24 for plug-in connectors; a suitable plug-in connector 26 being shown in phantom in FIG. 2. The mating end of the housing 12 may also include a flange 28 for mounting the housing to a face panel (not shown).

The cavities 16 have a forward portion 30 which is essentially the same diameter as the conductor pins 14 and an enlarged rearward portion 32 which provides a spacing 34 around the portions of the pins 14 disposed therein as shown in FIGS. 3 and 4. The pins 14 are preferably round and have tapered or pointed ends. Each pin 14 has a deformed medial band which provides lateral projections 36 for securing the pin 14 in its cavity. The pins 14 are initially straight (as shown in phantom in FIG. 2) and inserted into the cavities 16 at the mating end 18 of the housing 12 until the tail ends 38 project outwardly of the conductor end 20. During this insertion, the lateral projections 36 embed in the wall of the cavity portion 30 as shown in FIG. 4 so that the pins are secured in one direction and the contact ends of the pins project into the sockets 22 or 24.

As indicated earlier, the cavities 16 are in two rows. As shown in FIG. 1, each cavity in the upper row is aligned with a cavity in the lower row. The conductor end 20 of the housing 12 has an upper transverse anvil rail 40 and a lower transverse anvil rail 42. The anvil rail 40 runs along the ends of the cavities in the upper row and the anvil rail 42 runs along the ends of the cavities 16 in the lower row. The lower anvil rail 42 is offset from the upper anvil rail 40 toward the conductor end 18 in the longitudinal direction.

The conductor end 20 of the housing 12 also has a locator plate 44 which is beneath the lower anvil rail 42 and which extends beyond the upper anvil rail 40 in the longitudinal direction. The locator plate 44 has a plurality of longitudinal slots 46 which are slightly narrower than the tail ends 38. Each slot 46 is aligned vertically with a cavity 16 in the upper row and a cavity 16 in the lower row. Each slot has a forward detent 48 (i.e., toward the conductor end 18) and a rearward detent 50 which are formed by grooves in the side walls of the slot. The grooves forming the detents 48 and 50 are shaped to retain the tail ends 38 in the horizontal direction and provide a slip fit in the vertical direction.

The forward detents 48 are vertically aligned with the lower anvil rail 42 and the rearward detents 50 are vertically aligned with the upper anvil rail 40.

The locator plate 44 is firmly attached to the conductor end 20 of the housing 12 by gusset portions 52. The gusset portions 52 are narrower than the locator plate fingers 54 defined by the slots 46 to provide sufficient lateral flexibility so that the tails 38 can be forced into the slots 46 and snapped into the detents 48 and 50. The lower surface of the locator plate 44 has ribs 56 which provide solder flushing channels when the header assembly 10 is secured to a printed circuit board.

As indicated above, the conductor pins 14 are straight when inserted into the cavities 16. The conductor pins 14 in the lower row are assembled first. The tail ends 38 of these conductor pins are then bent perpendicular about the lower rail anvil 42 and forced into the slots 44 to the forward detents 48. The pins 14 in the lower row are now secured to the housing 12 by the lateral projections 36 embedded in surface 30 and the bent tail ends 38 engaging the lower anvil rail 42. The bent tail ends 38 are also accurately located by the detents 48 for assembly to a printed circuit board.

The conductor pins 14 in the upper row are then assembled in like manner. The tail ends 38 of these terminals are bent over the upper rail anvil 40 for securement to the housing and forced into the slots 44 to the rearward detents 50 for accurate location.

The housing 12 has a lateral flange 58 at each side for attaching the header 10 to a printed circuit board 60 by rivets or other suitable securing means as shown in FIG. 3. The printed circuit board 60 typically comprises upper and lower conductors 62 and 64 which are electrically connected to the pin conductors 14 by the bent tail ends 38 projecting beneath the housing 12. For this purpose, the printed circuit has a predetermined pattern of holes 66 which receive the tail ends 38 when the header 10 is attached. After attachment, the tail ends 38 are soldered in the holes 66 as indicated at 68. This secures the tail ends 38 to the printed circuit board 60 and provides a good electrical connection between the conductor pins 14 and the circuit board conductors. The lower ribs 56 of the locator plate 44 provides channels between the housing 12 and the printed circuit board as shown in FIG. 2. These channels are used to flush the soldered connections.

The locator plate 44 accurately locates the tail ends 38 of the conductor pins 14 which facilitates insertion of the tail ends 38 into holes 66 in the circuit board during assembly and ultimately enhances the electrical connections because closer tolerances can be held between the matching tail and hole patterns. The attached header 10 is also capable of higher temperature operation because of the enlarged cavity portions 32 and the slip fit of the detents 48,50. When subjected to high temperature operation, the thermoplastic housing 12 expands more than the metallic conductor pins 14. To compensate for the vertical differential thermal expansion, the horizontal tail end portions of the conductor pins 14 flex vertically downwardly in the oversize cavity portion 32 and the vertical tail portions slip vertically in the detents 48 and 50. Any horizontal differential thermal expansion is accommodated by the horizontal flexing of the tail portions between the locator plate 44 and the anvil rail 40 or 42.

The accommodation of differential thermal expansion relieves stress on the solder connections at 68, thus increasing the life and the reliability of the electric connections between the conductor pins 14 and the printed circuit board.

We wish it to be understood that we do not desire to be limited to the exact details of construction shown and described, for obvious modifications will occur to a person skilled in the art.

The embodiments of the invention in which an exclusive property or privilege is claimed are defined as follows:

1. A header assembly for a printed circuit board or the like comprising:
   a housing of thermoplastic material having a mating end, an opposite conductor end and a plurality of longitudinal cavities which extend longitudinally through the housing from the mating end to the conductor end,
   said housing having anvil means at the conductor ends of the cavities, and a longitudinal locator plate at the conductor end which is spaced from the anvil means in the transverse direction and which extends beyond the anvil means in the longitudinal direction,
   said locator plate having a plurality of longitudinal slots, each of which is aligned with at least one cavity,
   a plurality of metallic conductor pins disposed in the respective cavities, said conductor pins having bent tails which engage the anvil means to secure the conductor pins in the longitudinal direction, said bent tails projecting through the slots in the locator plate and retained in a prearranged pattern thereby, and
   means for accommodating differential thermal expansion between the housing and the conductor pins comprising a spacing in the rearward portion of the cavities which extends to the anvil means and permits the longitudinal portions of the conductor pins disposed therein to flex toward the locator plate, and a slip fit of the bent tails in the slots which permits the bent tails to slip in the transverse direction.

2. A header assembly for a printed circuit board or the like comprising:
   a housing of thermoplastic material having a mating end, an opposite conductor end and a plurality of longitudinal cavities which have a forward portion opening at the mating end and an enlarged rearward portion opening at the conductor end,
   said housing having anvil means at the conductor ends of the cavities, and a longitudinal locator plate at the conductor end which is spaced from the anvil means in the transverse direction and which extends beyond the anvil means in the longitudinal direction,
   said locator plate having a plurality of longitudinal slots, each of which is aligned with at least one cavity and each of which has at least one detent therein comprising grooves in the walls of the slot,
   a plurality of metallic conductor pins disposed in the respective cavities, said conductor pins having lateral projections which are embedded in the forward portion of the cavities and bent tails which engage the anvil means to secure the conductor pins in a longitudinal direction, and said bent tails projecting through the slots in the locator plate and retained in a prearranged pattern by the detents, and
   means for accommodating differential thermal expansion between the housing and the conductor pins comprising a spacing in the enlarged rearward portions of the cavities which extends to the anvil means and permits the longitudinal portions of the conductor pins disposed therein to flex toward the locator plate and a slip fit of the bent tails in the slots which permits the bent tails to slip in the transverse direction.

3. A header assembly for a printed circuit board or the like comprising:
   a housing of thermoplastic material having a mating end, an opposite conductor end and a plurality of longitudinal cavities which have forward portions opening at the mating end and enlarged rearward portions opening at the conductor end,
   said cavities being arranged in an upper row and a lower row with each of the cavities in the upper row being transversely aligned with a cavity in the lower row, said housing having forward and rearward anvil rails at the conductor ends of the cavities in the lower row and the upper row, respectively, and a longitudinal locator plate at the conductor end which is beneath the lower row of cavities and which extends beyond the rearward anvil rail, said locator plate having a plurality of longitudinal slots, each of which is transversely aligned with a cavity in each row and each of which has forward and rearward detents therein comprising grooves in the walls of the slots, and a plurality of metallic conductor pins disposed in the respective cavities, said conductor pins having lateral projections which are embedded in the forward portion of the cavities and bent tails which engage one of the anvil rails to secure the conductor pins in a longitudinal direction;

the bent tails of the conductor pins disposed in the cavities of the upper row projecting through the slots in the locator plate and retained therein by the rearward detents and the bent tails of the conductor pins disposed in the cavities of the lower row also projecting through the slots in the locator plate and retained by the forward detents whereby the tails project beneath the locator plate in a prearranged pattern, and means for accommodating differential thermal expansion between the housing and the conductor pins comprising a spacing in the enlarged rearward portions of the cavities which permits the longitudinal portions of the conductor pins disposed therein to flex toward the locator plate and a slip fit of the bent tails in the slots which permits the bent tails to slip in the transverse direction.

4. A header assembly for a printed circuit board or he like comprising:

a housing of thermoplastic material having a mating end, an opposite conductor end and a plurality of longitudinal cavities which have a forward portion opening at the mating end and an enlarged rearward portion opening at the conductor end, said housing having anvil means at the conductor ends of the cavities, and a longitudinal locator plate at the conductor end which is spaced from the anvil means in the transverse direction which extends beyond the anvil means in the longitudinal direction, said locator plate having a plurality of longitudinal slots, each of which is aligned with at least one cavity, a plurality of metallic conductor pins disposed in the respective cavities, said conductor pins having lateral projections which are embedded in the forward portion of the cavities and bent tails which engage the anvil means to secure the conductor pins in a longitudinal direction, and said bent tails projecting through the slots in the locator plate and retained in a prearranged pattern thereby, and means for accommodating differential thermal expansion between the housing and the conductor pins comprising a spacing in the enlarged rearward portions of the cavities which extends to the anvil means and permits the longitudinal portions of the conductor pins disposed therein to flex toward the locator plate and a slip fit of the bent tails in the slots which permits the bent tails to slip in the transverse direction.

5. A header assembly for a printed circuit board or the like comprising:

a housing of thermoplastic material having a mating end, an opposite conductor end and a plurality of longitudinal cavities which have forward portions opening at the mating end and enlarged rearward portions opening at the conductor end, said cavities being arranged in an upper row and a lower row with each of the cavities in the upper row being transversely aligned with a cavity in the lower row, said housing having forward and rearward anvil rails at the conductor ends of the cavities in the lower row and the upper row, respectively, and a longitudinal locator plate at the conductor end which is beneath the lower row of cavities and which extends beyond the rearward anvil rail, said locator plate having a plurality of longitudinal slots, each of which is transversely aligned with a cavity in each row, and a plurality of metallic conductor pins disposed in the respective cavities, said conductor pins having lateral projections which are embedded in the forward portion of the cavities and bent tails which engage one of the anvil rails to secure the conductor pins in a longitudinal direction, the bent tails of the conductor pins disposed in the cavities of the upper row projecting through the slots in the locator plate and retained therein and the bent tails of the conductor pins disposed in the cavities of the lower row also projecting through the slots in the locator plate forwardly of the bent tails of the conductor pins disposed in the cavities of the upper row and retained therein whereby the tails project beneath the locator plate in a prearranged pattern, and means for accommodating differential thermal expansion between the housing and the conductor pins comprising a spacing in the enlarged rearward portions of the cavities which permits the longitudinal portions of the conductor pins disposed therein to flex toward the locator plate and a slip fit of the bent tails in the slots which permits the bent tails to slip in the transverse direction.

* * * * *